United States Patent
Challa

(10) Patent No.: US 9,018,700 B2
(45) Date of Patent: Apr. 28, 2015

(54) DIRECT-DRAIN TRENCH FET WITH SOURCE AND DRAIN ISOLATION

(71) Applicant: Fairchild Semiconductor Corporation, San Jose, CA (US)

(72) Inventor: Ashok Challa, Sandy, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/173,587

(22) Filed: Feb. 5, 2014

(65) Prior Publication Data

US 2014/0264567 A1    Sep. 18, 2014

Related U.S. Application Data

(60) Provisional application No. 61/786,191, filed on Mar. 14, 2013.

(51) Int. Cl.
*H01L 29/78* (2006.01)
*H01L 21/336* (2006.01)
*H01L 29/66* (2006.01)

(52) U.S. Cl.
CPC ...... *H01L 29/7827* (2013.01); *H01L 29/66666* (2013.01)

(58) Field of Classification Search
CPC .............. H01L 29/7813; H01L 29/66734; H01L 29/4236
USPC ............. 257/330, E29.262, E21.41, 334, 257/E29.027, E29.121; 438/270, 589
See application file for complete search history.

(56) References Cited

U.S. PATENT DOCUMENTS

| | | | |
|---|---|---|---|
| 5,877,528 A * | 3/1999 | So | 257/341 |
| 6,274,457 B1 | 8/2001 | Sakai et al. | |
| 2008/0035993 A1* | 2/2008 | Cao et al. | 257/333 |
| 2008/0087951 A1* | 4/2008 | Takaya et al. | 257/334 |
| 2009/0035993 A1* | 2/2009 | Okayasu | 439/610 |
| 2009/0057756 A1* | 3/2009 | Hshieh | 257/330 |
| 2009/0085105 A1* | 4/2009 | Su et al. | 257/330 |
| 2010/0078774 A1* | 4/2010 | Hirler | 257/652 |
| 2010/0140697 A1* | 6/2010 | Yedinak et al. | 257/334 |
| 2011/0006363 A1* | 1/2011 | Hsieh | 257/330 |
| 2011/0254086 A1 | 10/2011 | Hsieh | |
| 2012/0132988 A1 | 5/2012 | Lui et al. | |
| 2013/0207172 A1* | 8/2013 | Hsieh | 257/315 |
| 2013/0330892 A1* | 12/2013 | Hsieh | 438/259 |

* cited by examiner

*Primary Examiner* — Marvin Payen
*Assistant Examiner* — Jeremy Joy
(74) *Attorney, Agent, or Firm* — Brake Hughes Bellermann LLP

(57) ABSTRACT

In a general aspect, an apparatus can include a semiconductor layer of a first conductivity type, the semiconductor layer having a top-side surface. The apparatus can also include a well region of a second conductivity type opposite the first conductivity type, the well region being disposed in an upper portion of the semiconductor layer. The apparatus can further include a gate trench disposed in the semiconductor layer, the gate trench extending through the well region, and a drain contact disposed, at least in part, on the top-side surface of the semiconductor layer, the drain contact being adjacent to the well region. The apparatus can still further include an isolation trench disposed between the drain contact and the gate trench in the semiconductor layer, the isolation trench extending through the well region.

21 Claims, 8 Drawing Sheets

DIRECT-DRAIN TRENCH FET WITH SOURCE AND DRAIN ISOLATION

RELATED APPLICATION

This application claims priority to and the benefit of U.S. Provisional Application No. 61/786,191, entitled "Direct-Drain Trench FET with Source and Drain Isolation," filed Mar. 14, 2013, which is incorporated herein by reference in its entirety.

TECHNICAL FIELD

This description relates to semiconductor devices and fabrication technology. In particular, the description relates to direct-drain trench gate field effect transistors (FETs).

BACKGROUND

Metal oxide semiconductor field effect transistor (MOSFET) devices may be broadly categorized according to the relative arrangement of source, gate and drain terminal structures, or the orientations of the source-to-drain channels relative to the surfaces of the semiconductor substrates on which the devices are formed. In a lateral channel MOSFET (lateral MOSFET), a source region and a drain region are arrayed in a lateral direction of a semiconductor substrate. The gate electrode is disposed on the silicon substrate between the source and drain regions. This lateral configuration of source, gate, and drain regions may be suitable for making smaller devices and for device integration. However, this lateral configuration may not be suitable for obtaining high power ratings for the devices because, for instance, the voltage blocking capability (breakdown voltage) of such a device can be proportional to the source-drain separation, and because the drain-to-source current can be inversely proportional to the length.

For power applications, vertical channel or trench gate MOSFETs (vertical MOSFETs) may be preferred. In some vertical channel MOSFET implementations, source, gate and drain regions are arranged in a vertical direction of a semiconductor substrate and/or a semiconductor layer. In such approaches, the source and drain terminals may be placed on opposite sides of a semiconductor substrate, and a gate electrode may be disposed in a groove or trench that is etched in the semiconductor substrate and/or semiconductor layer. This vertical configuration may be more suitable for a power MOSFET device, as the source and drain separation can be reduced. For instance, reduction of the source and drain separation can increase the drain-to-source current rating, reduce drain-to-source resistance $R_{DS}(on)$ while the transistor is on and also can allow for the use of an epitaxial layer for the drain drift region, which may increase the device's voltage blocking capability (e.g., increase the device's breakdown voltage).

In such vertical MOSFET devices, electrical connections can be applied to both sides of the package to provide a source connection and a gate connection (on one side), and a drain connection (on an opposite side). Using such an arrangement can make it difficult to package such transistors, particularly in packaging approaches such as Wafer Level Chip Scale Packaging (WLCSP), where electrical connections are typically available only on one side of a device.

When using WLCSP (or similar techniques) to package transistors, it may be desirable to place all the contacts for the transistor, including a source contact, a drain contact and a gate contact on the same side of the semiconductor substrate. This type of configuration allows for easy connection to circuit board traces using solder balls on a single surface of a substrate (e.g., in WLCSP) that are connected to each of the terminals of a given transistor.

However, implementing vertical MOSFET devices (e.g., power trench MOSFETs) in such a direct-drain (e.g., all electrical contacts on one side) configuration (which, for purposes of this disclosure, may be referred to as a direct-drain trench FET and/or a direct-drain FET) has a number of drawbacks. For instance, the arrangement of a source region, a well (body) region, a gate trench and a drain region in a direct-drain trench FET may result in a parasitic FET being formed, where the parasitic FET may cause undesired leakage from source to drain. Further, as source to drain spacing is reduced in a direct-drain trench FET, source to drain leakage may increase through the well region. In existing implementations, such leakage current can be reduced by increasing spacing between the source region and the drain region of the FET in order to reduce the efficiency of the parasitic MOSFET and/or by using a field plate to block formation of the well region between the source and drain. This increased source to drain spacing undesirably increases $R_{DS}(on)$ of the transistor and, therefore, limits the current rating of the transistor. Furthermore, increasing drain to source spacing results in increases to the size of a semiconductor substrate on which such a direct-drain trench FET is produced, thus increasing manufacturing costs.

SUMMARY

In a general aspect, an apparatus can include a semiconductor layer of a first conductivity type, the semiconductor layer having a top-side surface. The apparatus can also include a well region of a second conductivity type opposite the first conductivity type, the well region being disposed in an upper portion of the semiconductor layer. The apparatus can further include a gate trench disposed in the semiconductor layer, the gate trench extending through the well region, and a drain contact disposed, at least in part, on the top-side surface of the semiconductor layer, the drain contact being adjacent to the well region. The apparatus can still further include an isolation trench disposed between the drain contact and the gate trench in the semiconductor layer, the isolation trench extending through the well region.

In another general aspect, a direct-drain trench field effect transistor (FET) can include a semiconductor layer of a first conductivity type, an active region disposed in the semiconductor layer, an isolation region disposed in the semiconductor layer and a drain region disposed in the semiconductor layer, the isolation region being disposed between the active region and the drain region. The direct-drain trench FET can also include a well region of a second conductivity type opposite the first conductivity type, the well region being disposed in the semiconductor layer and extending from the active region through the isolation region to the well region. The drain region can include a direct-drain portion disposed, at least in part, on the semiconductor layer. The isolation region can include an isolation trench disposed in the semiconductor layer and extending through the well region.

In another general aspect, a method can include forming a semiconductor layer of a first conductivity type, the semiconductor layer having a top-side surface. The method can also include forming a well region of a second conductivity type, the well region being disposed in an upper portion of the semiconductor layer. The method can further include forming a gate trench disposed in the semiconductor layer, the gate trench extending through the well region. The method can still further include forming a drain contact on, at least in part, the top-side surface of the semiconductor layer, the drain contact being adjacent to the well region. The method can yet further include forming an isolation trench in the semiconductor layer between the drain contact and the gate trench, the isolation trench extending through the well region.

The details of one or more implementations are set forth in the accompanying drawings and the description below. Other features will be apparent from the description and drawings, and from the claims.

BRIEF DESCRIPTION OF THE DRAWINGS

Like reference symbols in the various drawings indicate like and/or similar elements.

DETAILED DESCRIPTION

Figure 1A:
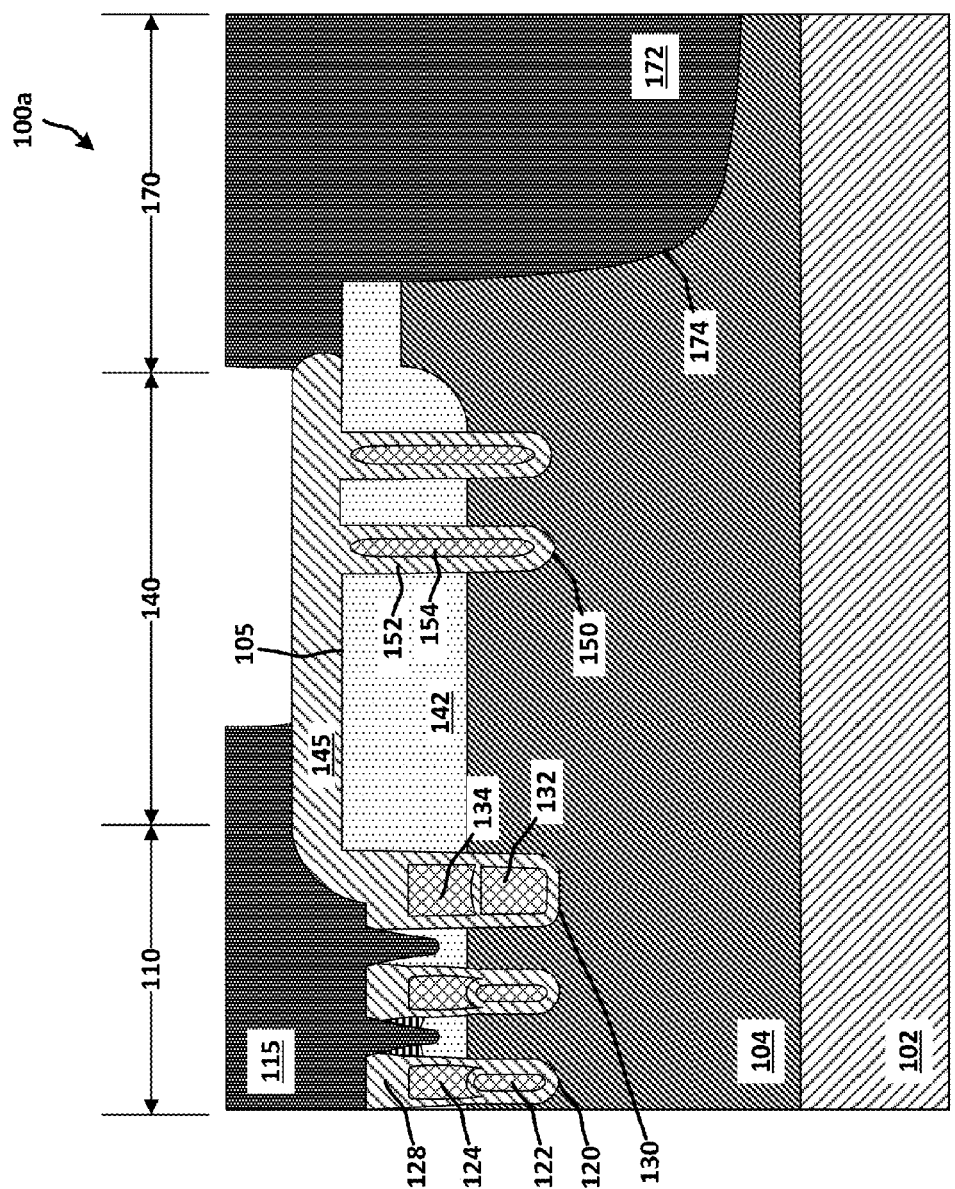
FIGS. 1A-1D are cross-sectional diagrams of direct-drain trench field effect transistors (FETs) including multiple isolation trenches, according to implementations.

In the following detailed description (and in the accompanying drawings) a number of example implementations of direct-drain vertical FETs (and associated methods of manufacture) are described and illustrated. The illustrated devices (and methods) include a number of similar aspects, as well as a number of variations from one illustrated implementation to another. In some embodiments, one or more aspects of one implementation may be likewise implemented in one or more other implementations. For instance the configuration of a drain region 170 shown in FIG. 1C could also be implemented in any of the implementations shown in FIGS. 1A, 1B, 1D, 3A and 3B (e.g., in place of their drain regions 170) and vice versa. Further, each element and aspect of each of the implementations illustrated in the figures may not be discussed with respect to each of the figures.

Also, for purposes of clarity, in the implementations illustrated in the drawings and described below (both within a single drawing and from drawing to drawing) each instance of a given element or aspect may not be referenced with a dedicated reference number. For instance, FIG. 1A includes two isolation trenches, though only one of those trenches is specifically referenced with the reference number 150. As another example, electrodes 122, 124 are referenced only once in FIG. 1A, though multiple instances are illustrated. As a further example, the electrodes 122, 124 are not referenced at all in FIG. 1C. Furthermore, throughout the drawings, like and/or similar elements and aspects are referenced with like reference numbers. For example, active regions in each of the drawings are referenced the reference number 110, though the active regions 110 may vary from implementation to implementation. The foregoing described examples are merely given by way of illustration, and other similar instances are present throughout the drawings.

Additionally, in the following description, the various implementations of direct-drain trench FET devices illustrated in FIGS. 1A-3B are described, for purposes of illustration, as implementing n-channel devices. However, in other implementations, the devices illustrated in FIGS. 1A-3B may be used to implement p-channel devices (e.g., by using opposite conductivity types and/or biasing potentials as those discussed below).

FIGS. 1A-1D are cross-sectional diagrams of direct-drain trench field effect transistors (FETs) 100a-100d including multiple isolation trenches 150, according to example implementations. As noted above, for purposes of illustration, the FETs 100a-100d are described as n-channel devices, though substantially the same structure can be used to implement p-channel devices, such as by using opposite conductivity types to those indicated below.

FIG. 1A is a cross-sectional diagram of a direct-drain trench FET 100a (FET 100a), according to an implementation. As illustrated in FIG. 1A, the FET 100a includes an active region 110, an isolation region 140 and a drain region 170. In FIG. 1A (and likewise in FIGS. 1B-1D), only a portion of the active region 110 and a portion of the drain region 170 are shown.

As illustrated in FIG. 1A, the FET 100a may include a substrate 102 and a semiconductor layer 104. In an implementation, the substrate 102 may include a heavily doped n-type semiconductor substrate and the semiconductor layer 104 may include a lightly doped n-type epitaxial layer. The semiconductor layer 104 and the substrate 102 may function as the drift region of the FET 100a, where current between the active region 110 and the drain region 170 (when the FET 100a is on) substantially flows, vertically, through the semiconductor layer 104 and, laterally, through the substrate 102. Of course, leakage currents and/or other currents may be present in the FET 100a during its operation.

As shown in FIG. 1A, the semiconductor layer 104 has a top-side surface 105. The top side surface 105 may be aligned along a first plane. In certain embodiments, one or more portions of the top-side surface 105 may be recessed. For instance, in the FET 100a, the active region 110 may include such a recessed top-side surface portion (e.g., disposed below a source interconnect layer 115), where the recessed top-side surface portion may be aligned along a second plane that is substantially parallel to the plane of the top-side surface 105. In the FET 100a, the second plane of the recessed top side-surface portion may be defined by upper surfaces of semiconductor mesas that are disposed in the active region 110, such as are discussed below with respect to FIG. 2. In other embodiments, the first plane (corresponding with the top-side surface 105) and the second plane (corresponding with the upper surface of the mesas) may be the same plane. That is, the second plane may not be recessed with respect to the first plane.

The FET 100a also includes a lightly doped p-type well region 142 that extends from the active region 110, through the isolation region 140 and into the drain region 170 (where the well region 142 is interrupted by the various trenches of the FET 100a). The p-type well 142 may be formed in an upper portion of the semiconductor (epitaxial) layer 104 (e.g., at the top-side surface 105) and may also include (form) a body region of the FET 100a (e.g., in the mesas of the active region 110). The well region 142 may be formed using a well diffusion process to diffuse p-type dopants, such as boron, in the semiconductor layer 104.

Figure 1C:
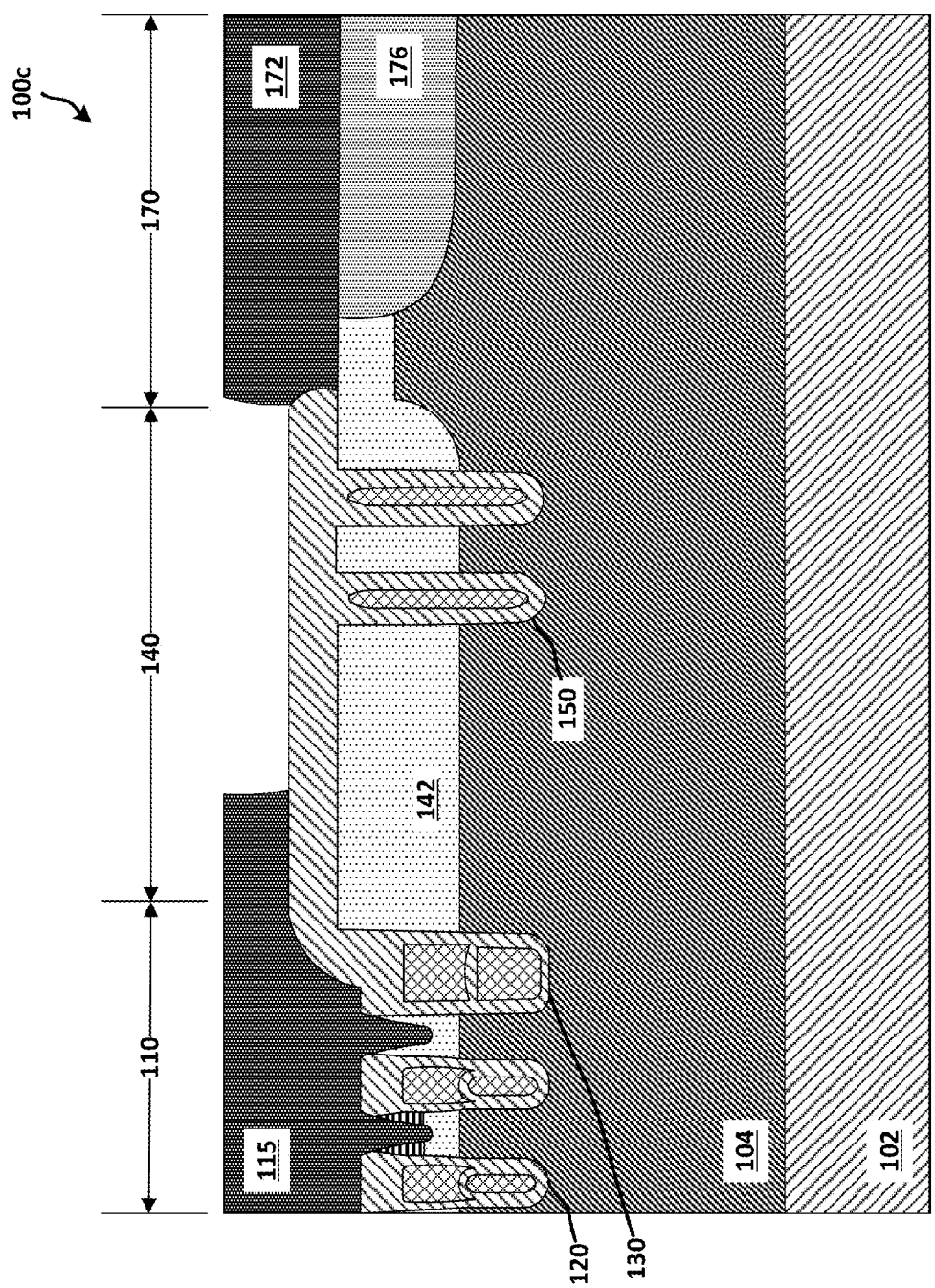
Figure 2:
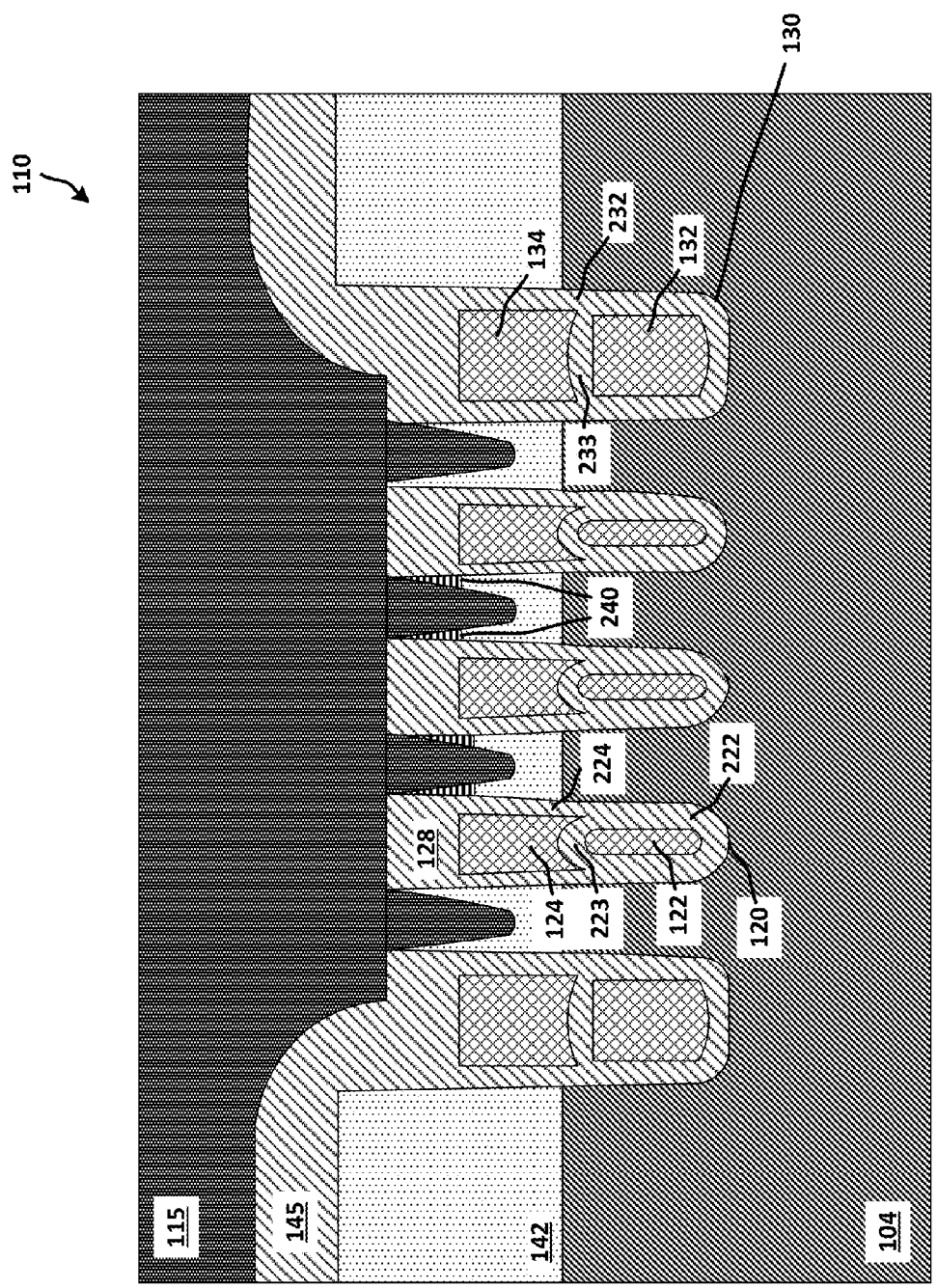
FIG. 2 is a cross-sectional diagram of an active region of a direct-drain trench FET, according to an implementation.

A more detailed view of the active region 110 is illustrated in FIG. 2 and is discussed in further detail below. Briefly, however, as shown in FIG. 1A, the active region 110 of the FET 100a includes multiple gate trenches 120 and a termination trench 130 that extend through the well region. While only two gate trenches 120 and a single termination trench 130 are shown in FIG. 1C, as indicated above, only a portion of the active region 110 is shown in FIG. 1A. In an embodiment, the FET 100*a* may include additional gate trenches 120 and additional termination trenches 130, such as in the arrangement shown, for example, in FIG. 2. In other implementations, one or more addition termination trenches 130 may be disposed adjacent to one another.

In the FET 100*a*, the gate trenches 120 each have a shield electrode 122 and a gate electrode 124 disposed therein. In similar fashion, the termination trench 130 has a termination shield electrode 132 and a shield gate electrode 134 disposed therein. Each of the shield electrodes 122 and the termination shield electrode 132 may be electrically coupled with one another (and to the source potential), such as by using a shield connection runner (not shown). In an embodiment, such a shield connection runner may be disposed at an edge (or outer perimeter) of the FET 100*a* and/or the active region 110. In like fashion, the gate electrodes 124 and the termination gate electrode 134 may also be electrically coupled with one another, such as by using a gate connection runner (not shown) that may be implemented in similar fashion as the shield connection runner. The shield connection runner and the gate connection runner may be formed, for example, using one or more doped polysilicon layer or layers, though other approaches are possible.

As shown in FIG. 1A, the active region 110 also includes a dielectric cap layer 128 that is disposed on top of (e.g., above) the gate electrodes 124 and insulates the gate electrodes 124 from a source interconnect (metal) layer 115. The source interconnect layer 115 may be used to provide a source potential (e.g., electrical ground or a negative potential) to a source (e.g., n-type implant) region and a body region (e.g., p-type body) of the FET 100*a*. The dielectric cap layer 128 may also be used to insulate the termination gate electrode 134 from the source interconnect layer 115, such as is shown in FIG. 1A.

Figure 3A:
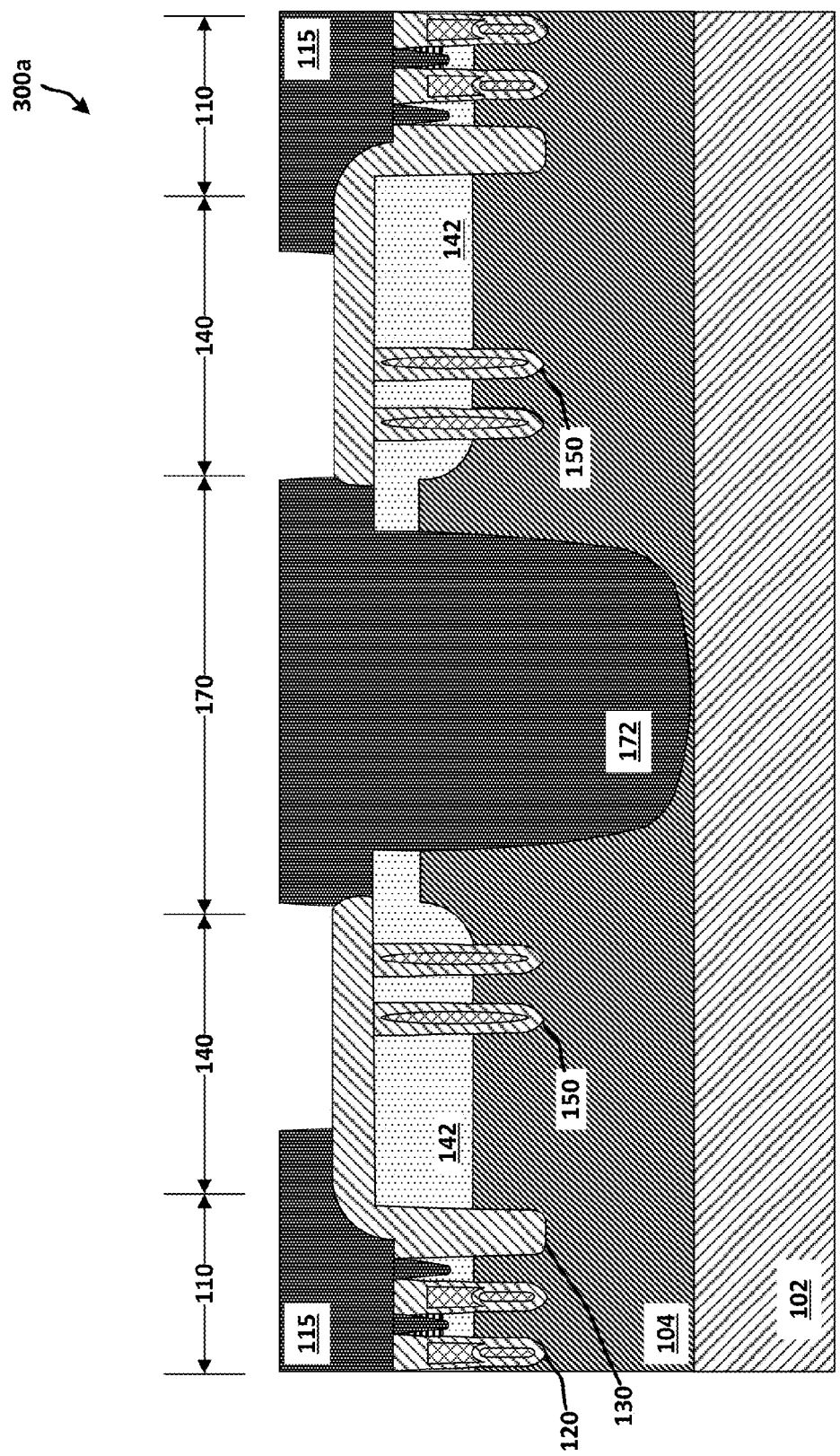
FIGS. 3A and 3B are cross-sectional diagrams of direct-drain trench FETs, according to other implementations.
Figure 3B:
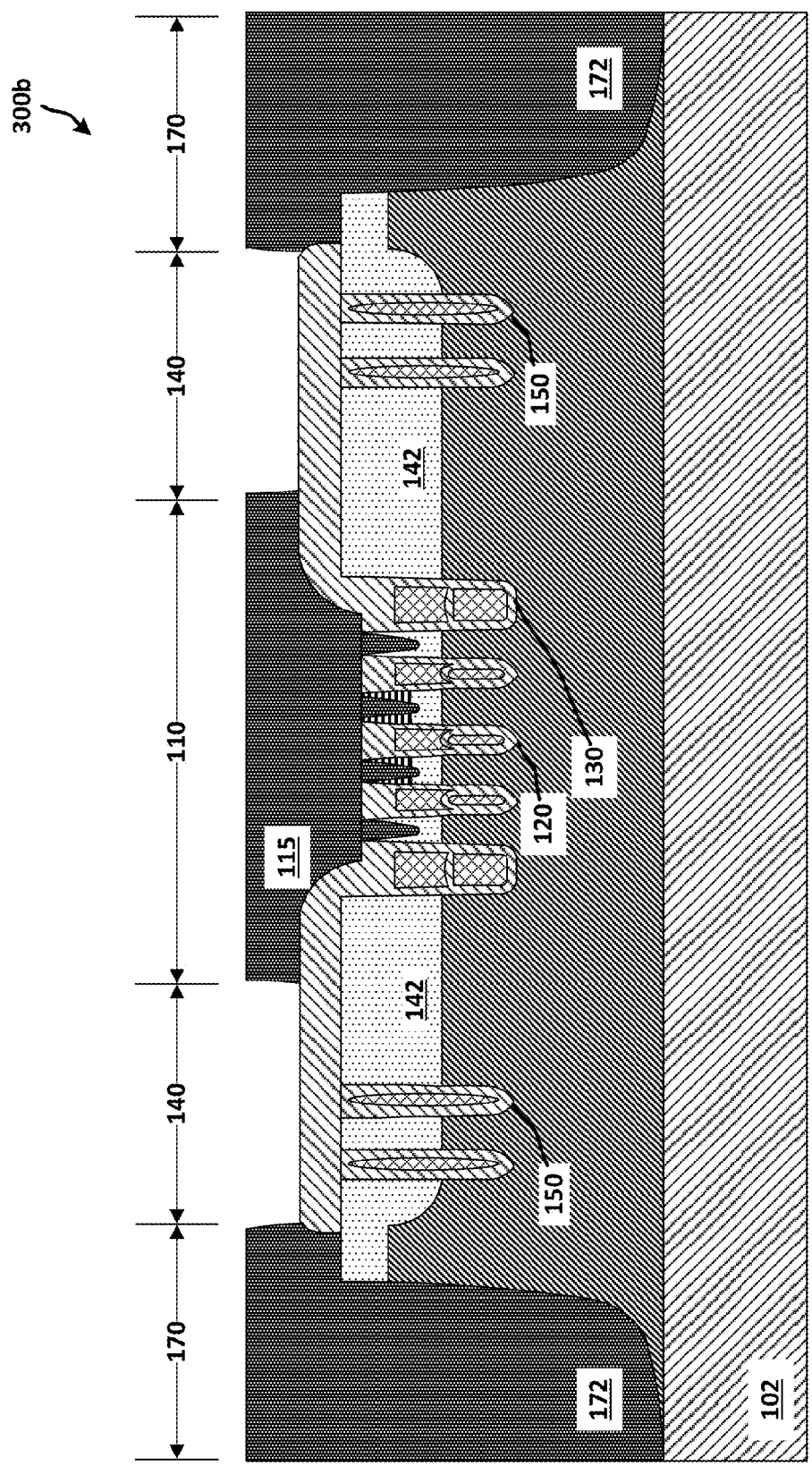

As is also shown in FIG. 1A, the drain region 170 includes a drain contact 172 formed on the top-side surface 105 of the semiconductor layer 104. The drain contact 172 may be formed in a number of fashions. For instance, the drain contact 172 may include a salicide portion (e.g., to reduce contact resistance with the semiconductor layer 104). The drain contact 172 may also include one or more metal layers, such as titanium, nickel, aluminum and/or copper, as some examples. In the embodiments described herein, the source interconnect layer 115 may be formed in a similar fashion as the drain contact 172 using one or more of the some semiconductor process operations (semiconductor processes). As illustrated in FIG. 1A, the drain contact 172 of the FET 100*a* is formed in a drain contact trench 174. Such an arrangement may reduce the resistance from the substrate 102 to the drain contact 172 and, as a result, reduce the overall $R_{DS}$(on) of the FET 100*a*. In other embodiments, the drain contact trench 174 (and the drain contact 172) may extend to the interface between the semiconductor layer 104 and the substrate 102 (such as illustrated in FIGS. 3A and 3B), while in still other embodiments, the drain contact trench 174 (and the drain contact 172) may extend through the semiconductor layer 104 and into the substrate 102.

In the FET 100*a*, the isolation region 140 includes multiple isolation trenches 150 that are disposed in the semiconductor layer 104 and extend through the well region 142. In some embodiments, a single isolation trench 150 may be included in the isolation region 140, while in other embodiments, additional isolation trenches 150 (more than two) may be included in the isolation region 140. In some embodiments, the isolation trenches 150 (and the isolation region 140), when viewed from the top surface of the FET 100*a*, may be arranged such that they substantially surround, or completely surround the active region 110. In like fashion, in certain embodiments, the drain region 170 may be arranged such that it substantially surrounds, or completely surrounds the isolation region 140. In such arrangements, the isolation region 140 and the drain region 170 may be concentrically disposed around the active region 110. In other embodiments, the drain region 170 may be arranged as stripes disposed on both sides of the active/isolation regions 110,140. In some embodiments, the termination trenches 130 may surround the active region 110. Alternatively, the termination trenches 130 can be arranged as stripes on both sides of the active region 110 (as shown in FIG. 1A) with additional termination structures (trenches) being disposed along the other two sides of the active region 110 (e.g., substantially perpendicular to the gate trenches 120 at both a proximal end and distal end of the gate trenches 120).

The isolation region 140 of the FET 100*a* also includes a dielectric layer 145 that is disposed on the surface of the semiconductor layer 104. The dielectric layer 145 extends laterally into the active region 110 (e.g., to the termination trench 130) and insulates the source interconnect layer 115 from the portion of the well region 142 in the isolation region 140 that is disposed between the termination trench 130 and the isolation trenches 150. In some embodiments, the dielectric layer 145 may be formed using the same dielectric layer that is used to form the dielectric cap layer 128. In other embodiments, the dielectric layer 145 may be formed using a different dielectric layer than is used to form the dielectric cap layer 128. For instance, the dielectric cap layer 128 may be formed using a first semiconductor process (e.g., including a first dielectric deposition or formation process), while the dielectric layer 145 may be formed using a second semiconductor process (e.g., including a second dielectric deposition or formation process).

As shown in FIG. 1A, each isolation trench 150 includes an isolation dielectric layer 152 that lines a sidewall of the isolation trench 150 and an isolation electrode 154. The isolation electrodes 154 may be formed using a suitable conductive material, such as doped polysilicon or a metal. In some embodiments, the isolation electrodes 154 may be formed concurrently with, and from the same material as the shield electrodes 122 (and the termination shield electrode 132). In other embodiments, the isolation electrodes 154 may be formed concurrently with, and from the same materials as the gate electrodes 124 (and the termination gate electrode 134). In still other embodiments, the isolation electrodes 154 may be formed independently of the other electrodes 122, 124, 132, 134 of the FET 100*a* (using one or more semiconductor processes).

In certain embodiments, the isolation trenches 150 can be formed at different times, e.g., using one or more different semiconductor processes. For instance, in some embodiments, the isolation trenches 150 may be formed to have different dimensions (e.g., one of the isolation trenches 150 may be deeper, shallower, narrower and/or wider than the other). In such approaches, one of the isolation trenches 150 could be masked more narrowly than the other (or masked using a different masking process), which may result in the more narrowly masked isolation trench 150 being both shallower and narrower than the other isolation trench 150. In other embodiments, one of the isolation trenches 150 may include the isolation electrode 154, while the other isolation trench 150 does not include the isolation electrode 154 (e.g., is filled, or substantially filled with the dielectric 152). In still other embodiments, the isolation trenches 150 may each include isolation electrodes 154 that are of different configurations (e.g., different height, width, shape and/or so forth). In these various embodiments, the isolation trenches 150 should extend to a depth that is greater than a depth of the well region 142, so as to break the continuity of the well region 142 between the source and drain in order to reduce and/or eliminate source to drain leakage in the FET 100a. Increasing the number of isolation trenches 150 will further reduce the magnitude of leakage between the source and drain in the FET 100a. However, adding additional isolation trenches 150 will increase the area of the isolation region 140 and, accordingly, increase the size (substrate area) of the FET 100a.

In example implementations, the isolation electrodes 154 may be configured to operate at a floating potential (e.g., may be substantially surrounded by one or more dielectric materials and/or layers). In such an arrangement, during operation of the FET 100a, the isolation electrodes 154 will float to (or near) the drain potential. Accordingly, the isolation trenches 150, and the isolation structures disposed therein, may significantly reduce the efficiency of a parasitic (p-type) MOSFET device formed between the active region and the drain region and also reduce leakage current from source to drain of the FET 100a.

Such a parasitic MOSFET may include a source terminal formed by a portion of the well region 142 in the isolation region 110 that is closest to the termination trench 130, a gate terminal formed by the termination shield electrode 132 and a drain electrode formed by a portion of the well region 142 that is closest to the drain contact 172. In the arrangement shown in FIG. 1A, the isolation trenches 150 provide electrical isolation between the active region and the drain region, e.g., by suppressing turn-on of the parasitic MOSFET. Additionally, the isolation electrodes 154 being configured to float to the drain potential of the FET 100a may further suppress turn-on of the parasitic MOSFET.

Accordingly, the arrangement of the isolation trenches 150 in the FET 100a may significantly reduce source to drain leakage in the FET 100a during an off-state of the device. In certain embodiments, it is desirable that the leakage be extremely low (e.g., less than 1 µA), which may be accomplished using such an arrangement as is shown in FIG. 1A. In example embodiments, the isolation trenches 150 can be placed (within semiconductor process limits) at any position between the termination trench 130 and the drain contact 172 (drain region 170) in the FET 100a (or in other embodiments, such as those described herein).

Further, the reduction in leakage provided by the use of the isolation trenches 150 may allow for reduced source to drain spacing in the FET 100a (e.g., to photolithographic limits of a given semiconductor process) as compared to current implementations (which may be, for example, limited by lateral well diffusion variations and/or parasitic parameter variations). This reduced spacing (e.g., in the FET 100a) can allow for reduced transistor sizes, which, in turn, decreases $R_{DS}(on)$ of the FET 100a, thus increasing a given device's current rating. The resulting reduction in $R_{DS}(on)$ may also allow for further reductions in transistor size due to the increased current capacity for a transistor of a given physical size (e.g., as determined by semiconductor substrate area). That is, with reduced $R_{DS}(on)$, the same current carrying capacity can be achieved by a smaller transistor.

Figure 1B:
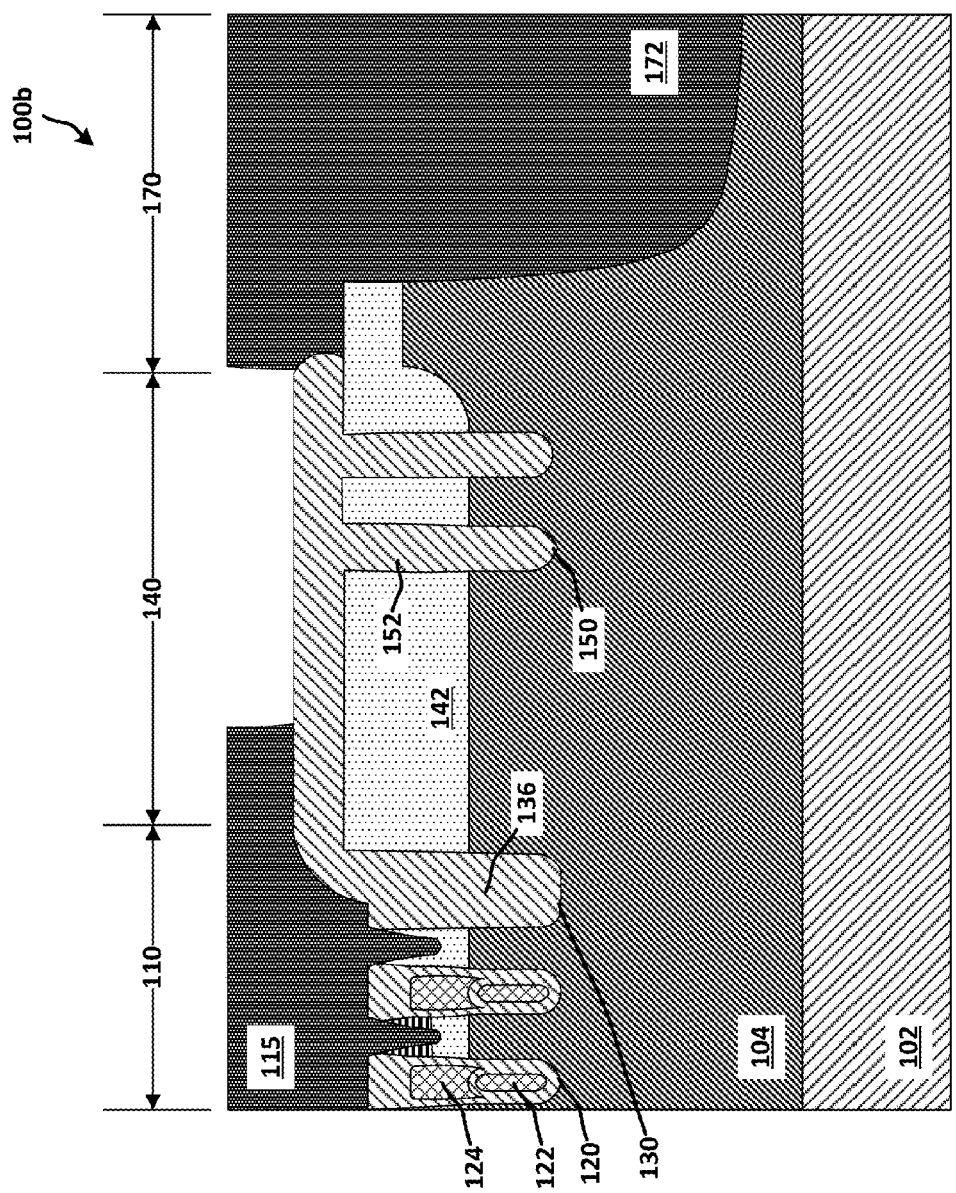

FIG. 1B is a cross-sectional diagram of a direct-drain trench FET 100b (FET 100b) that is similar to the FET 100a illustrated in FIG. 1A. Accordingly, various elements of the FET 100b that correspond with elements of the FET 100a are referenced with the same reference numbers in FIG. 1B as in FIG. 1A.

As illustrated in FIG. 1B, as compared to the FET 100a in FIG. 1A, the termination trench 130 and isolation trenches 150 of the FET 100b do not include any electrodes. For instance, rather than including a trench shield electrode 132 and a trench gate electrode 134 disposed within the termination trench 130 of the FET 100b, the termination trench 130 is filled (substantially filled) with a dielectric 136.

Similar to the termination trench 130 of the FET 100b, the isolation trenches 150 of the FET 100b are filled (substantially filled) with dielectric 152, rather than having isolation electrodes disposed within the isolation trenches. Such an approach may simply formation of the isolation trenches 150 and associated isolation structures in some semiconductor manufacturing process. For instance, in certain embodiments, the dielectric 136 and the dielectric 152 may be formed concurrently using a same dielectric formation process. However, in other embodiments, the dielectric 136 and the dielectric 152 may be formed using different dielectric formation processes.

In some implementations, only one of the termination trench 130 or the isolation trenches 150 may be filled with dielectric, as shown in FIG. 1B. In such approaches, either the termination trench 130 or the isolation trenches 150 may have one or more electrodes disposed therein (e.g., such as illustrated in FIG. 1A). For instance, in one embodiment, the termination trench 130 (or termination trenches 130) may be filled (substantially filled) with a dielectric (e.g., the dielectric 136) and the isolation trenches 150 may have electrodes (e.g., floating electrodes) 154 disposed therein, such as in the implementation illustrated in FIG. 3A. In other embodiments, the isolation trenches 150 may be filled (substantially filled) with a dielectric (e.g., the dielectric 152) and the termination trench 130 (or termination trenches 130) may be have a termination shield electrode 132 and/or a termination gate electrode 134 disposed therein.

FIG. 1C is a cross-sectional diagram of a direct-drain trench FET 100c (FET 100c) that is similar to the FET 100a illustrated in FIG. 1A (and the FET 100b illustrated in FIG. 1B). Accordingly, as with FIG. 1B, various elements of the FET 100c that correspond with elements of the FET 100a are referenced with the same reference numbers in FIG. 1C as in FIG. 1A.

As illustrated in FIG. 1C, as compared to the FET 100a in FIG. 1A, the FET 100c includes a drain (n-type) implant region 176 disposed in the semiconductor (n-type epitaxial) layer 104. Such an approach may reduce an amount of stress (e.g., mechanical stress) that the FET 100c is subjected to, as compared to the approach of forming a drain contact trench 174 and filling the drain contact trench 174 with the drain contact 172 metal shown, for example, in FIGS. 1A and 1B. In such an approach, the drain implant region 176 may be formed by implanting an n-type dopant (e.g., arsenic) into the semiconductor layer 104. In the FET 100c, the drain contact 172 is disposed on the drain implant region. As with the drain contact 172 in FIG. 1A, the drain contact 172 in FIG. 1C may include a salicide portion (e.g., on the surface of the drain implant region 176) and one or more metals layers. In other embodiments, a drain contact trench may be formed (e.g., in similar fashion as the drain contact trench 174 shown in FIG. 1A) and the drain implant region 176 may be formed by implanting an n-type dopant in the semiconductor layer 104 at the bottom of the drain contact trench. In such an arrangement, the drain contact 172 may then be disposed in the drain contact trench and disposed on the drain implant region 176.

Figure 1D:
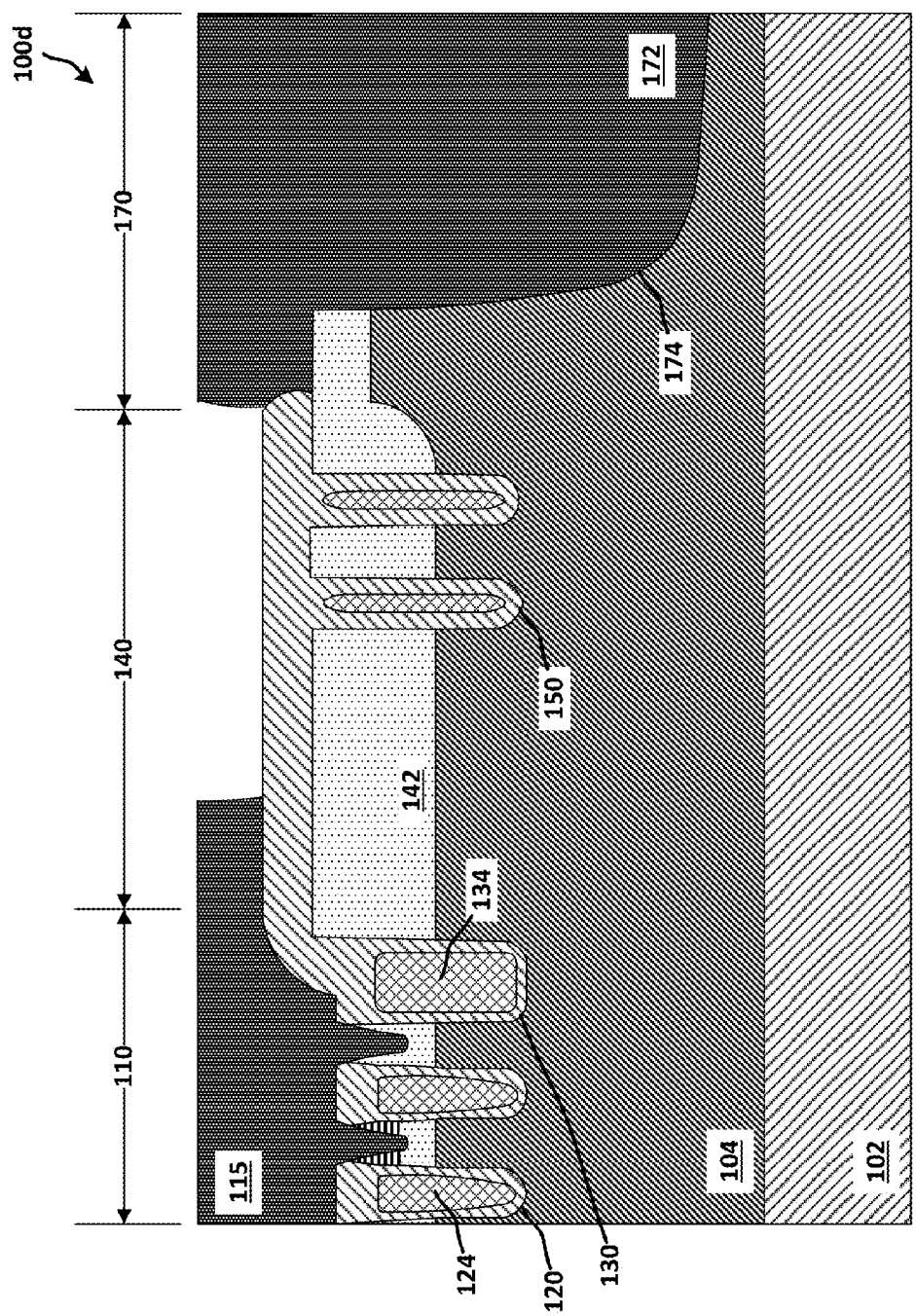

FIG. 1D is a cross-sectional diagram of a direct-drain trench FET 100d (FET 100d) that is similar to the FET 100a illustrated in FIG. 1A (and the FETs 100b and 100c shown, respectively, in FIGS. 1B and 1C). Accordingly, as with FIGS. 1B and 1C, various elements of the FET 100d that correspond with elements of the FET 100a are referenced with the same reference numbers in FIG. 1D as in FIG. 1A.

As illustrated in FIG. 1D, as compared to the FET 100a in FIG. 1A, the gate trenches 120 and the termination trench 130 of the FET 100d do not include any shield electrodes. For instance, rather than including shield electrodes 122 and gate electrodes 124 disposed within the gate trenches 120 of the FET 100d, the gate trenches 120 each include a (single) gate electrode 124 (that is disposed within a gate dielectric).

Similar to the gate trenches 120 of the FET 100d, the termination trench 130 of the FET 100d includes a (single) termination gate electrode 134 (that is disposed within a termination dielectric, which may be thicker than the gate dielectric). In some implementations, as compared with the FET 100a, the shield electrodes (122, 124), in the FET 100d, may be eliminated from only one of the termination trench 130 or the gate trenches 120. In such approaches, either the termination trench 130 or the gate trenches 120 may have both shield and gate electrodes disposed therein (e.g., such illustrated in FIG. 1A), while the other trench (or trenches) include only a gate electrode. In such an approach, the gate trenches 120 may include a thinner (gate) dielectric in an upper portion of the gate trenches 120, while including a thicker dielectric in a lower portion of the gate trenches 120. A similar arrangement to that shown in FIG. 1D can be achieved in the FETs 100a-100c shown in FIGS. 1A-1C by electrically connecting the shield electrodes 122 with the gate electrodes 124, such as by using a runner and/or metal connection (not shown) on the surface of the device. Such approaches may also be implemented in embodiments that have multiple termination trenches 130.

FIG. 2 is a cross-sectional diagram showing a more detailed view of an active region 110 of a direct-drain trench FET, according to an implementation. The active region 110 shown in FIG. 2 corresponds with the active regions 110 shown FIGS. 1A and 1C. Accordingly, like elements of the active region 110 illustrated in FIG. 2 are referenced with same reference numbers as their corresponding elements in FIGS. 1A and 1C. Also, as was indicated above, only a portion of the active region 110 is shown in FIGS. 1A and 1C (and similarly with the active regions 110 in FIGS. 1B and 1D). The active region 110 shown in FIG. 2 illustrates an example of a complete active region 110 that may be implemented in a direct-drain trench FET, such as those described herein.

As illustrated in FIG. 2, the active region 110 includes a plurality of gate trenches 120 with a first termination trench 130 disposed on one side of the plurality of gate trenches 120 and a second termination trench 130 disposed on the other side of the plurality of gate trenches 120. In other embodiments, the active region 110 may include additional gate trenches 120 disposed between the termination trenches 130. The termination trenches 130 may be arranged in a number of ways, such as those described herein.

As show in FIG. 2, the shield electrodes 122 may be disposed within a shield dielectric 222 (e.g., where the shield dielectric is disposed on a lower portion of a sidewall of the gate trenches 120). Likewise, the termination shield electrodes 132 may be disposed within a termination dielectric 232 (e.g., where the termination dielectric 232 is disposed on a sidewall of the termination trenches 130). An inter-electrode dielectric (IED) 223 may be disposed on the shield electrodes 122, where the IED 223 is disposed between and insulates the gate electrodes 124 from the shield electrodes 122. Similarly, an IED 233 may be disposed on the termination shield electrode 132, where the IED 233 is disposed between and insulates the termination gate electrode 134 from the termination shield electrode 134. As illustrated in FIG. 2, the dielectric cap layer 128 is disposed on the gate electrodes 124 (and the termination gate electrode 134 in some embodiments).

Each gate trench 120 of the active region 110 shown in FIG. 2 may have a gate dielectric 224 disposed on an upper portion of the sidewall of the gate trench 120, and the gate electrode 124 may be disposed within the gate dielectric 224. The gate electrodes 124 and the gate dielectrics 224 are used, during operation of a corresponding trench FET device, to form a conduction channel for the device. For instance, the conduction channel may be formed from source (n-type) implant regions 240 to the semiconductor layer 104 (through the p-type well (body) region 142). As discussed herein, the semiconductor layer 104 may form at least part of a drift region of a corresponding trench FET device.

The source implant regions 240, as illustrated in FIG. 2, may be formed by implanting n-type dopants into semiconductor mesa regions (which can be referred to as mesas or semiconductor mesas) that are formed in the (p-type) well 142 of the semiconductor layer 104. These semiconductor mesas may be defined by the formation of the gate trenches 120 and/or the termination trenches 130 in semiconductor layer 104 (and well 142). As shown in FIG. 2, the source implant regions are electrically contacted by the source interconnect layer 115 with metal fill contacts 245. In other embodiments, the source regions 240 may be contacted by the source interconnect layer 115 using other structures, such as a contact disposed on a surface of the mesa. Such a contact may include a salicide layer that is disposed on the mesa surface, in like manner as described herein with respect to the drain contact 172.

In some implementations, the gate dielectric 224 of the FET 100a may be a thinner dielectric than the shield dielectric 222 and/or the termination dielectric 232. In such an arrangement, the termination gate electrode 134, in comparison to the gate electrodes 124, is disposed within the (thicker) termination dielectric 232 rather than within the thinner gate dielectric 224. Also, as shown in FIG. 2, the active region 110 does not include source implants 240 in the semiconductor mesa regions that are disposed between the outermost gate trenches 120 and the termination trenches 130. In certain implementations, disposing the termination gate electrodes 134 within the thicker termination dielectric 232 (as opposed to a thinner gate dielectric) and the absence of source implants 240 in the outer mesas (e.g., the mesas adjacent to the termination trenches 130) may reduce electric fields at the edges (periphery) of the active region 110, which may increase a breakdown voltage (or breakdown voltages) of a direct-drain trench FET that includes an active region 110 such as shown in FIG. 2.

FIGS. 3A and 3B are cross-sectional diagrams of direct-drain trench FETs 300a and 300b (FETs 300a and 300b), according to example implementations. The FETs 300a and 300b shown in FIGS. 3A and 3B illustrate examples of devices in which active regions 110, isolation regions 140 and drain regions 170 (and their corresponding elements, as well as other elements of a direct-drain trench FET) can be inter-digitated (interleaved).

For instance, the FET 300a shown in FIG. 3A includes a central drain region 170 (with its associated elements) and two active regions 110 (with its associated elements) disposed on opposites sides of the central drain region 170. The FET 300a also includes two isolation regions 140 (with their associated elements) and two well regions 142, which are also disposed on opposite sides of the central drain region 170 (between the active regions 110 and the central drain region 170). In such an arrangement, during operation of the FET 300a, current may flow between the central drain region 170 and each of the active regions 110. In FIG. 3A, the FET 300a is illustrated using a like device structure as that illustrated in FIG. 1B, with the exception of the isolation trenches 150 having isolation electrodes disposed therein as opposed to being filled (substantially filled) with a dielectric. In other implementations, other devices structures, such as those described herein may be used in the FET 300a.

The FET 300b shown in FIG. 3B includes a central active region 110 (with its associated elements) and two drain regions 170 (with their associated elements) disposed on opposites sides of the central active region 110. The FET 300b also includes two isolation regions 140, which are also disposed on opposite sides of the central active region 110 (between the drain regions 170 and the central active region 110). In such an arrangement, current may flow between the central active region 110 and both of the drain regions 170 (e.g., in both lateral directions). In FIG. 3B, the FET 300b is illustrated using a like device structure as that illustrated in FIG. 1A. In other implementations, other devices structures, such as those described herein may be used in the FET 300b.

In some implementations, the general arrangements of the FETs 300a and 300b may be combined to form larger direct-drain trench FETs with multiple, inter-digitated active regions 110, isolation regions 140 and drain regions 170. In such devices, the active regions 110, isolation regions 140 and drain regions 170 may be arranged in a concentric arrangement, where the associated direct-drain trench FET may have a central drain region 170 (as shown in FIG. 3A) or, in other implementations, a central active region 110 (as shown in FIG. 3B). In still other embodiments, the active regions 110, isolation regions 140 and drain regions 170 may be disposed in a lateral arrangement.

Figure 4:
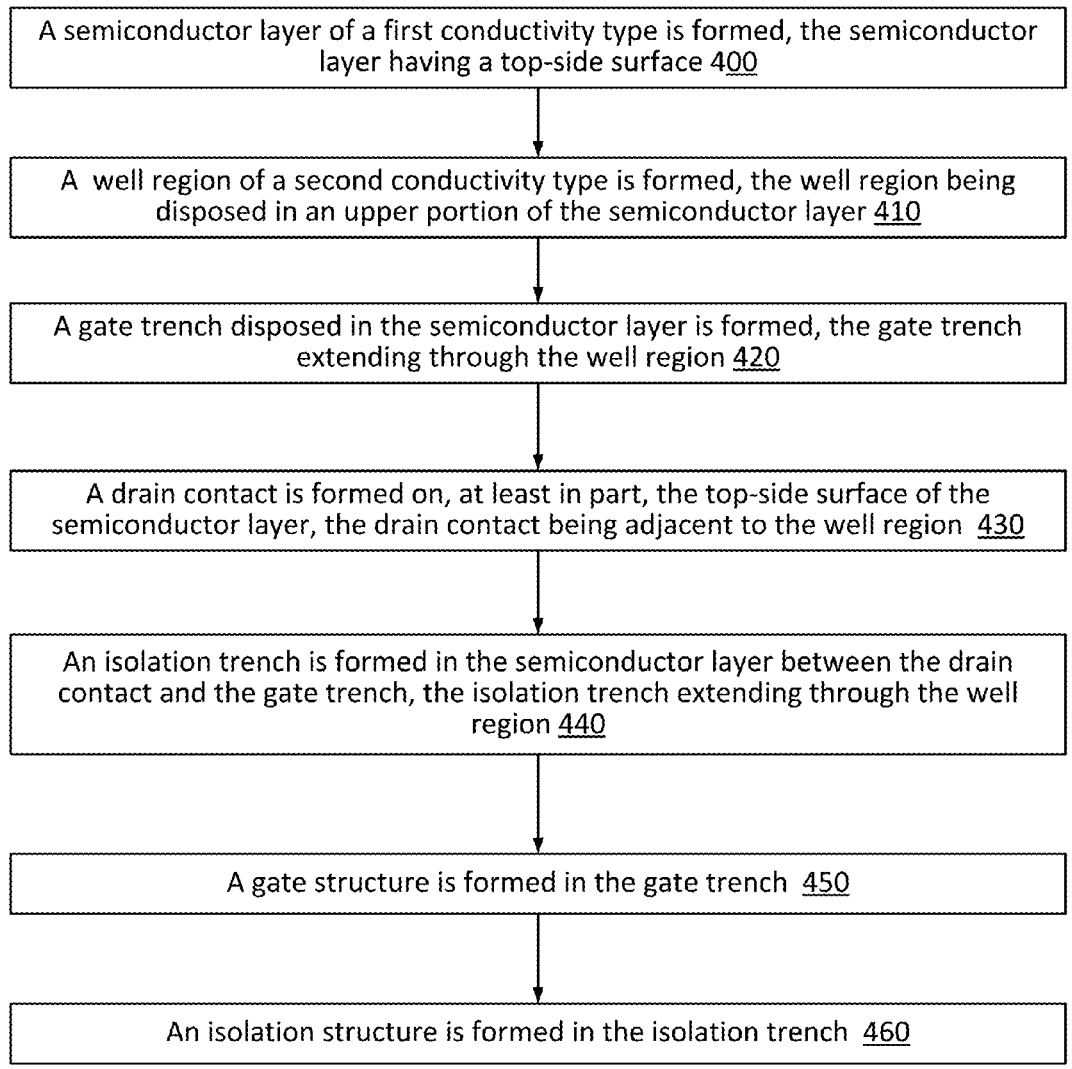
FIG. 4 is a flowchart illustrating a method for forming a direct-drain trench FET, in accordance with an implementation.

FIG. 4 is a flowchart illustrating a method for forming a direct-drain trench FET, in accordance with an implementation. In some embodiments, the method of FIG. 4 can be used to implement the direct-drain trench FET devices illustrated in FIGS. 1A-3B. In other implementations, the method illustrated in FIG. 4 can be used to implement direct-drain trench FET devices having other configurations, such as direct-drain trench FETs having one or more features of one of the implementations shown FIGS. 1A-3B included in one of the other implementations shown in FIGS. 1A-3B. In still other implementations, other methods can be used to produce the direct-drain trench FETs illustrated in FIGS. 1A-3B. Further, the operations shown in FIG. 4 may be performed in a number of appropriates orders. Also, in some implementations, an operation of the method may be performed in multiple stages, where the order of performing those stages with respect to the other operations of the method will depend on the particular embodiment.

In the method illustrated in FIG. 4, a semiconductor layer of a first conductivity type is formed, where the semiconductor layer has a top-side surface (block 400). The semiconductor layer may be a lightly doped n-type epitaxial layer, such as may be used for producing n-channel FETs, such as those discussed above. A well region of a second conductivity type (e.g., p-type) is formed (block 410). The well region may be disposed in an upper portion of the semiconductor layer and include a body region of a direct-drain trench FET, such as those described herein.

As illustrated in FIG. 4, a gate trench disposed in the semiconductor layer is formed, where the gate trench extends through the well region (block 420). A drain contact is formed on, at least in part, the top-side surface of the semiconductor layer, where the drain contact is formed adjacent to the well region (block 430). As discussed above, in some embodiments, the drain contact may be formed in a drain contact trench (e.g., as shown in FIG. 1A). In other embodiments, a drain implant region (e.g., n-type for an n-channel FET) may be disposed in the semiconductor layer (epitaxial layer). In such an approach, the drain contact may be formed on the surface of the semiconductor layer and disposed on the drain implant region (e.g., as shown in FIG. 1C). In certain embodiments, the well region may be formed after forming the drain contact. In the method of FIG. 4, an isolation trench is formed in the semiconductor layer (block 440), where the isolation trench is disposed between the drain contact and the gate trench. The isolation trench may extend through the well region.

A gate structure is formed in the gate trench (block 450). Forming the gate structure may include forming a shield dielectric, a shield electrode, an IED, a gate dielectric and/or a gate electrode. For instance, the gate structure of block 450 may be implemented as one of the gate structures discussed above with respect to FIGS. 1A-3B.

As illustrated in FIG. 4, an isolation structure is formed in the isolation trench (block 460). In certain embodiments, forming the isolation structure could be performed at a different point in the method. For instance, in some embodiments, the isolation structure may be formed before the drain contact is formed, while in other embodiments, such processes for forming a direct-drain trench FET isolation structure (as well as other associated processes) may be performed in other orders.

In some embodiments, forming the isolation structure at block 460 may include forming a dielectric on a sidewall of the isolation trench and then forming an isolation electrode within the dielectric. The dielectric may insulate the isolation electrode from the semiconductor layer and the well region, such as discussed above with respect to, for example, FIG. 1A. The isolation electrode may be configured to operate at a floating potential, such that it floats to a (positive) drain potential during operation of an associated direct-drain trench FET that is produced using the method of FIG. 4. In other embodiments, forming the isolation structure may include substantially filling the isolation trench with dielectric material. The dielectric material in the isolation trench may be formed using one or more dielectric formation (deposition and/or growth) processes.

In certain embodiments, other processes may also be performed in conjunction with those illustrated in FIG. 4 to form a direct-drain trench FET. Such processes may include, as some examples, forming a source region, forming a source interconnect layer 115, forming (gate, shield and/or isolation) electrode interconnect layers and/or forming one or dielectric layers disposed on one or more electrodes. For instance, in one embodiment, a dielectric that is disposed on a gate electrode (e.g., the gate electrode 124) may take the form of the dielectric cap layer 128 illustrated, for example, in FIG. 1A. Such a dielectric cap layer 128 may also be used to form a dielectric layer that extends between a termination trench (of an active region) and the isolation trench (e.g., indicated as dielectric layer 145 in FIG. 1A). Of course, a number of other processes may also be performed in addition to the processes shown in FIG. 4. Also, in some embodiments, one or more of the processes shown in FIG. 4 may be eliminated.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus comprising:
   a semiconductor layer of a first conductivity type, the semiconductor layer having a top-side surface;
   a well region of a second conductivity type opposite the first conductivity type, the well region being disposed in an upper portion of the semiconductor layer;
   a gate trench disposed in the semiconductor layer, the gate trench extending through the well region;
   a drain contact disposed, at least in part, on the top-side surface of the semiconductor layer, the drain contact being adjacent to the well region;
   an isolation trench disposed between the drain contact and the gate trench in the semiconductor layer, the isolation trench extending through the well region;
   a termination trench disposed in the semiconductor layer and disposed between the gate trench and the isolation trench, the termination trench extending through the well region; and
   at least one termination electrode disposed in the termination trench.

2. The apparatus of claim 1, further comprising:
   a dielectric; and
   an isolation electrode disposed within the dielectric in the isolation trench, the isolation electrode being configured to operate at a floating potential.

3. The apparatus of claim 1, further comprising a dielectric disposed within the isolation trench, the dielectric substantially filling the isolation trench.

4. The apparatus of claim 1, wherein the isolation trench is a first isolation trench, the apparatus further comprising a second isolation trench, the second isolation trench being disposed between the first isolation trench and the drain contact.

5. The apparatus of claim 1, wherein the isolation trench is a first isolation trench, the apparatus further comprising a second isolation trench, the second isolation trench being disposed between the first isolation trench and the gate trench.

6. The apparatus of claim 1, further comprising:
   a gate dielectric disposed on a sidewall of the gate trench;
   a gate electrode disposed in the gate trench and disposed within the gate dielectric; and
   a source region disposed in the well region, the source region being adjacent to the gate trench.

7. The apparatus of claim 1, further comprising a drain contact trench disposed in the semiconductor layer, at least a portion of the drain contact being disposed within the drain contact trench.

8. The apparatus of claim 1, further comprising a drain implant region of the first conductivity type, the drain contact being disposed on the drain implant region.

9. The apparatus of claim 1, wherein the gate trench is a first gate trench, the apparatus further comprising:
   an isolation electrode disposed in the isolation trench;
   a dielectric disposed in the termination trench, disposed in the isolation trench and disposed on the well region between the termination trench and the isolation trench, the dielectric insulating the termination electrode from, at least, the semiconductor layer and insulating the isolation electrode from the semiconductor layer and the well region; and
   a second gate trench disposed between the first gate trench and the second gate trench, the second gate trench extending through the well region.

10. The apparatus of claim 1, wherein the well region is a first well region, the gate trench is a first gate trench and the isolation trench is a first isolation trench, the apparatus further comprising:
    a second well region disposed in the semiconductor layer on an opposite side of the drain contact as the first well region;
    a second gate trench disposed in the semiconductor layer on the opposite side of the drain contact, the second gate trench extending thorough the second well region; and
    a second isolation trench disposed between the drain contact and the second gate trench in the semiconductor layer, the second isolation trench extending through the second well region.

11. The apparatus of claim 1, wherein the drain contact is a first drain contact and the isolation trench is a first isolation trench, the apparatus further comprising:
    a second drain contact disposed, at least in part, on the top-side surface of the semiconductor layer and on an opposite side of the gate trench as the first drain contact; and
    a second isolation trench disposed between the second drain contact and the gate trench in the semiconductor layer, the second isolation trench extending through the well region.

12. A direct-drain trench field effect transistor (FET), comprising:
    a semiconductor substrate of a first conductivity type;
    a semiconductor layer of the first conductivity type disposed on the semiconductor substrate, the semiconductor layer having a doping concentration that is lower than a doping concentration of the semiconductor substrate;
    an active region disposed in the semiconductor layer;
    an isolation region disposed in the semiconductor layer;
    a drain region disposed in the semiconductor layer, the isolation region being disposed between the active region and the drain region; and
    a well region of a second conductivity type opposite the first conductivity type, the well region being disposed in the semiconductor layer and extending from the active region through the isolation region to the well region,
    the drain region including a direct-drain contact disposed, at least in part, on the semiconductor layer, the direct-drain contact extending through the semiconductor layer and terminating at an interface between the semiconductor layer and the semiconductor substrate,
    the isolation region including an isolation trench disposed in the semiconductor layer and extending through the well region.

13. The direct-drain trench FET of claim 12, wherein the active region includes:
    a gate trench extending through the well region;
    a shield dielectric disposed on a gate trench sidewall in a lower portion of the gate trench;
    a shield electrode disposed within the shield dielectric;

an inter-electrode dielectric disposed on the shield electrode;
a gate dielectric disposed on the gate trench sidewall in an upper portion of the gate trench;
a gate electrode disposed within the gate dielectric; and
a source region of the first conductivity type, the source region being disposed in the well region and adjacent to the gate trench.

14. The direct-drain trench FET of claim 13, wherein the active region further includes a source interconnect layer, the source interconnect layer including a metal-filled contact disposed in the well region and in contact with the source region.

15. The direct-drain trench FET of claim 13, wherein the active region further includes:
a termination trench extending through the well region, the termination trench being disposed between the gate trench and the isolation trench.

16. The direct-drain trench FET of claim 12, further comprising:
an isolation electrode disposed in the isolation trench; and
an isolation dielectric disposed in the isolation trench, the isolation dielectric insulating the isolation electrode from the well region and the semiconductor layer.

17. The direct-drain trench FET of claim 12, further comprising an isolation dielectric disposed in the isolation trench, the isolation dielectric substantially filling the isolation trench.

18. A method comprising:
forming a semiconductor layer of a first conductivity type, the semiconductor layer having a top-side surface;
forming a well region of a second conductivity type, the well region being disposed in an upper portion of the semiconductor layer;
forming a gate trench disposed in the semiconductor layer, the gate trench extending through the well region;
forming a drain contact on, at least in part, the top-side surface of the semiconductor layer, the drain contact being adjacent to the well region;
forming an isolation trench in the semiconductor layer between the drain contact and the gate trench, the isolation trench extending through the well region;
forming a termination trench in the semiconductor layer and between the gate trench and the isolation trench, the termination trench extending through the well region; and
forming at least one termination electrode in the termination trench.

19. The method of claim 18, further comprising forming a dielectric in the isolation trench, the dielectric substantially filling the trench.

20. The method of claim 18, further comprising:
forming a dielectric on a sidewall of the isolation trench;
forming an isolation electrode within the dielectric, the dielectric insulating the isolation electrode from the semiconductor layer and the well region.

21. The method of claim 18, wherein the forming the termination trench is performed before the forming the isolation trench.

\* \* \* \* \*